United States Patent [19]
Sato et al.

[11] 4,449,141
[45] May 15, 1984

[54] VARIABLE CAPACITOR

[75] Inventors: Yasuo Sato; Takamasa Sakai, both of Tokyo, Japan

[73] Assignee: Clarion Co., Ltd., Tokyo, Japan

[21] Appl. No.: 331,359

[22] Filed: Dec. 16, 1981

[30] Foreign Application Priority Data

Dec. 18, 1980 [JP] Japan .................. 55-180060

[51] Int. Cl.³ ........................... H01L 29/92
[52] U.S. Cl. ......................... 357/14; 357/51; 357/15; 357/90; 357/23
[58] Field of Search .......... 357/14, 51, 23 C, 15, 357/15 V, 90, 23.6

[56] References Cited

U.S. PATENT DOCUMENTS

| | | | |
|---|---|---|---|
| 3,679,948 | 7/1972 | Wenzig | 357/90 X |
| 3,953,264 | 4/1976 | Wu | 357/14 X |
| 3,969,750 | 7/1976 | Dhaka et al. | 357/14 |

FOREIGN PATENT DOCUMENTS 8983  1/1979  Japan .................. 357/51

*Primary Examiner*—Martin H. Edlow
*Assistant Examiner*—W. Mintel
*Attorney, Agent, or Firm*—Flynn, Thiel, Boutell & Tanis

[57] ABSTRACT

A variable capacitor comprises a plurality of variable capacity elements each having depletion layer control section and a capacity reading section both formed on a semiconductor substrate so that the capacity appearing at each capacity reading section varies in accordance with the bias voltage applied to the depletion layer control sections. Portions of the semiconductor substrate where the capacity reading sections are formed have different carrier concentrations, respectively, so that the capacity read out at the capacity reading section also varies in accordance with the carrier concentration.

19 Claims, 9 Drawing Figures

VARIABLE CAPACITOR

BACKGROUND OF THE INVENTION

1. Field of the Invention

This invention relates to a variable capacitor capable of precisely controlling capacity variation over a wide range.

2. Description of the Prior Art

Conventionally, there has generally been used a PN junction element as a variable capacitor as shown in FIG. 1. In FIG. 1, the reference numeral 1 designates an N-type semiconductor region, 2 a P-type semiconductor region, 3 a PN junction, 4 and 5 ohmic electrodes provided in the regions 1 and 2, respectively, 6 and 7 leading terminals provided on the electrodes 4 and 5, respectively, and 8 a depletion layer.

With this arrangement, the depletion layer 8 increases or decreases in response to bias voltage applied to the leading terminals 6 and 7, whereby the variation of capacity in accordance with the increase and decrease of the depletion layer 8 is read out between the leading terminals 6 and 7.

However, the conventional variable capacitor utilizing such a PN junction element has had the following drawbacks:

(1) Due to the fact that the conventional variable capacitor makes use of the fact that the increase or decrease of the depletion layer at the PN junction is dependent on the bias voltage, the minimum capacity is determined by impurity concentration in the semiconductor regions while the maximum capacity is determined by the increase of the conductance component. Therefore, it is practically impossible to permit a large variable range of the capacity when the Q factor is large. Additionally, the larger the capacity variation the higher the Q factor becomes. Therefore, the conventional variable capacitor is attended with difficulties in designing the circuit.

(2) Due to the fact that supply of the bias voltage for varying capacity and reading of the capacity variation are performed by means of the common leading terminals, the capacitor is apt to cause undesired capacity variation in response to voltage of the input signal itself when the capacitor is adopted in a resonance circuit, etc., resulting in signal deterioration. Further, since there is required a specific circuit arrangement in which interference between the input signal voltage and the bias voltage is small, the conventional variable capacitor is restricted to a few uses.

(3) The impurity concentration in the semiconductor regions for determining the capacity of the depletion layer is controlled by a control means such as diffusion, ion implantation, etc. However, since such means cannot realize a good yield, integration in an IC circuit is practically impossible.

OBJECT OF THE INVENTION

It is therefore an object of the present invention to solve such conventional drawbacks, and more specifically to provide a variable capacitor in which variable capacitor elements comprising a depletion layer control section and a capacity reading section are provided on a semiconductor substrate so that the capacity appearing at respective capacity reading sections differ from each other in accordance with carrier concentration of the substrate around the capacity reading section.

SUMMARY OF THE INVENTION

In accordance with the present invention, there is provided a variable capacitor which comprises:
a semiconductor substrate;
a plurality of variable capacitor elements each having a depletion layer control section and a capacity reading section both formed on said substrate;
a bias voltage applying means for applying bias voltage to said depletion layer control section; and
a variable voltage source for supplying said bias voltage,
at least portions of said semiconductor substrate where said capacity reading sections are positioned having different carrier concentrations from each other.

DETAILED DESCRIPTION OF THE PREFERRED EMBODIMENTS

Figure 1:
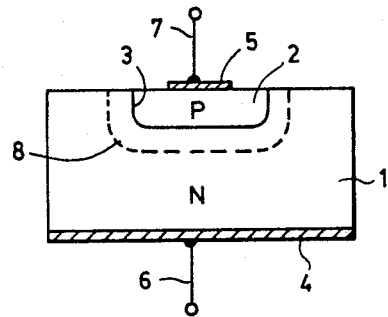
FIG. 1 is a diagrammatic sectional view illustrating a conventional variable capacitor.

The present invention will now be described in detail referring to the preferred embodiments illustrated in the drawings.

Figure 2:
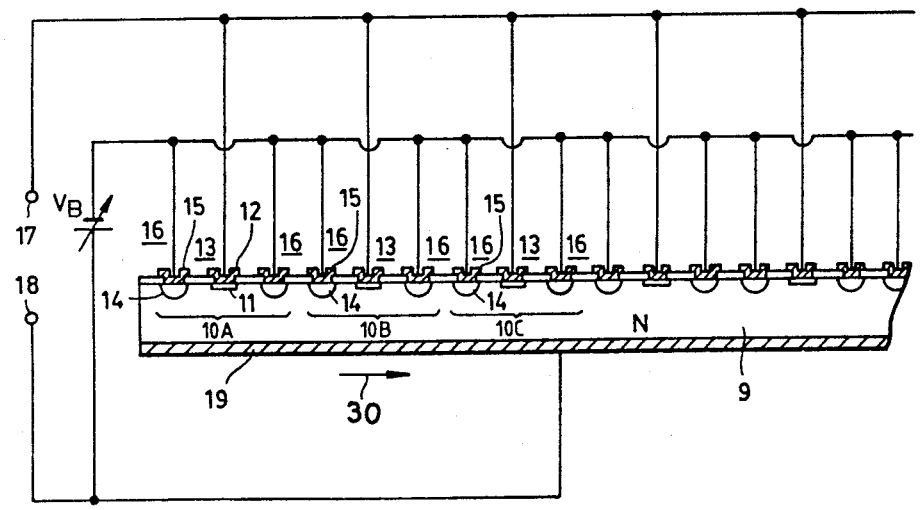
FIGS. 2, 5, 6 and 7 are each a diagrammatic sectional view of a variable capacitor according to the present invention.

FIG. 2 shows a sectional view illustrating a variable capacitor according to the present invention in which the reference numeral 9 denotes a semiconductor substrate such as an N-type silicone, for example, and 10A, 10B, 10C . . . each denote a variable capacitor element having a capacity reading section 13 and a depletion layer control section 16. The capacity reading section 13 comprises a P-type region 11 provided on the N-type substrate 9 and a metallic electrode 12 provided on the P-type region 11 while the depletion layer control section 16 comprises at least one P-type region 14 provided adjacent to the P-type region 11 and a metallic electrode 15 provided on the P-type region 14.

At least the capacity reading sections 13 of the variable capacitor elements 10A, 10B, 10C . . . are positioned at locations on the semiconductor substrate 9 where the carrier concentration differs from each other. The semiconductor substrate 9 may be so formed that the carrier concentration thereof gradually rises or lowers in the arrow direction 30, for example.

Further, the reference numeral $V_B$ denotes a bias voltage commonly applied by a variable voltage source to the depletion layer control sections 16 of respective variable capacitor elements 10A, 10B, 10C . . . , 17 and 18 denote total capacity reading terminals and 19 denotes an ohmic electrode provided along the back surface of the semiconductor substrate.

Figure 3:
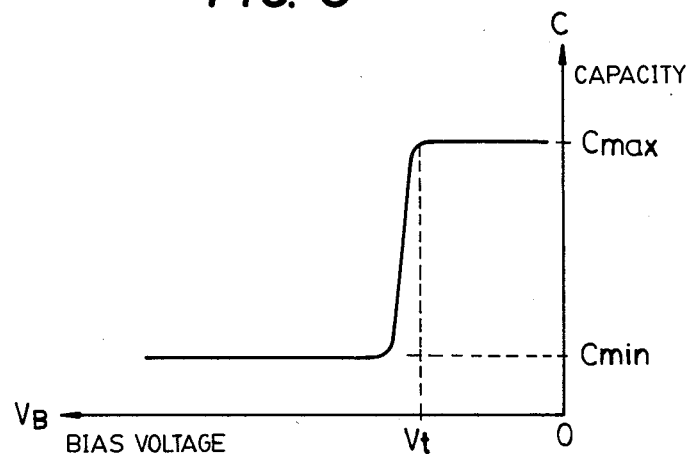
FIGS. 3 and 4 each show a graph for explaining the present invention.

With this arrangement, the characteristic of the capacity C of one of the variable capacitor elements with respect to the bias voltage $V_B$ appears as shown in FIG. 3. The capacity C goes up to be the maximum value $C_{max}$ when the bias voltage is zero or near zero. However, as the bias voltage is slowly raised past the peculiar value $V_t$ (threshold value) of the element, the capacity C rapidly drops to the minimum value $C_{min}$ and is thereafter kept in this condition. The threshold value $V_t$ varies in accordance with the carrier concentration of the semiconductor substrate 9 in the region where the variable capacitor element (at least the capacity reading section) is positioned.

Figure 4:
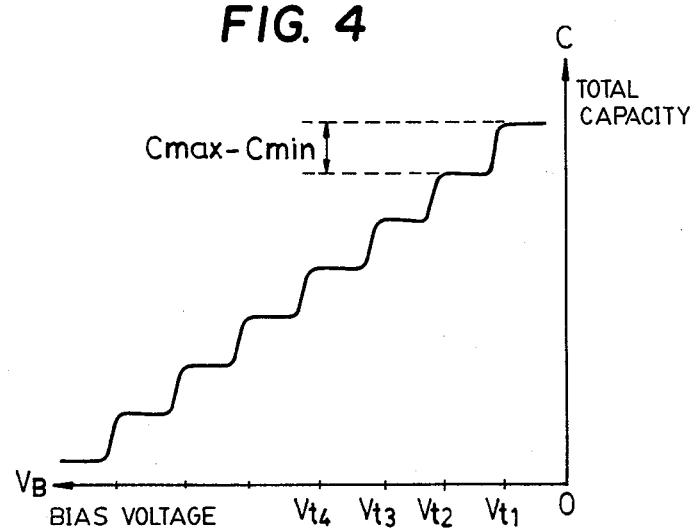

Therefore, when a bias voltage is commonly applied to the variable capacitor elements having different threshold values which are integrated in parallel within the semiconductor substrate 9 as shown in FIG. 2, then the total capacity characteristic appears to vary in a step-like manner as shown in FIG. 4 where respective characteristics as shown in FIG. 3 are continuously connected.

If the respective maximum capacities $C_{max}$ of the variable capacitor elements 10A, 10B, 10C . . . are small and a plurality of the variable capacitor elements 10A, 10B, 10C are integrated, the widths of the steps in the characteristic of FIG. 4 become smaller, thus obtaining a steep and accurate variation. Accordingly, the $C_{max}/C_{min}$ proportion can be high and the total variation range of the capacity is made large. Further, because only some of the elements sensitively actuate in response to the bias voltage being within a certain range while the others are kept to be $C_{max}$ or $C_{min}$ to thereby maintain a steady condition against the variation of the bias voltage, the variation of the Q factor can be kept small.

The characteristic of the capacity C with respect to the bias voltage $V_B$ can be determined as desired by controlling the variation of the carrier concentration in the semiconductor substrate 9.

Figure 5:
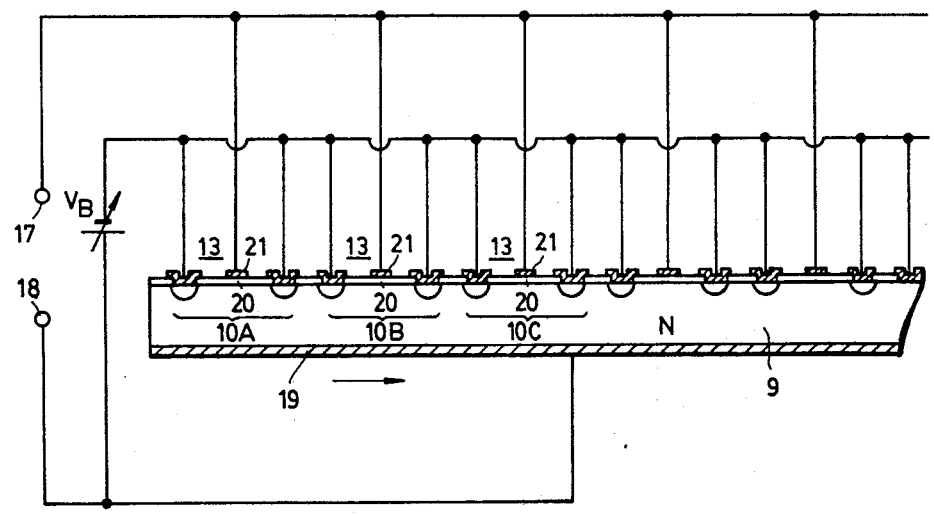

FIG. 5 shows another embodiment according to the present invention in which the capacity reading section 13 has a so-called MIS structure comprising insulator layer 20 such as an oxidant layer, for example, formed on the semiconductor substrate 9 and an electrode provided on the insulator layer.

Figure 6:
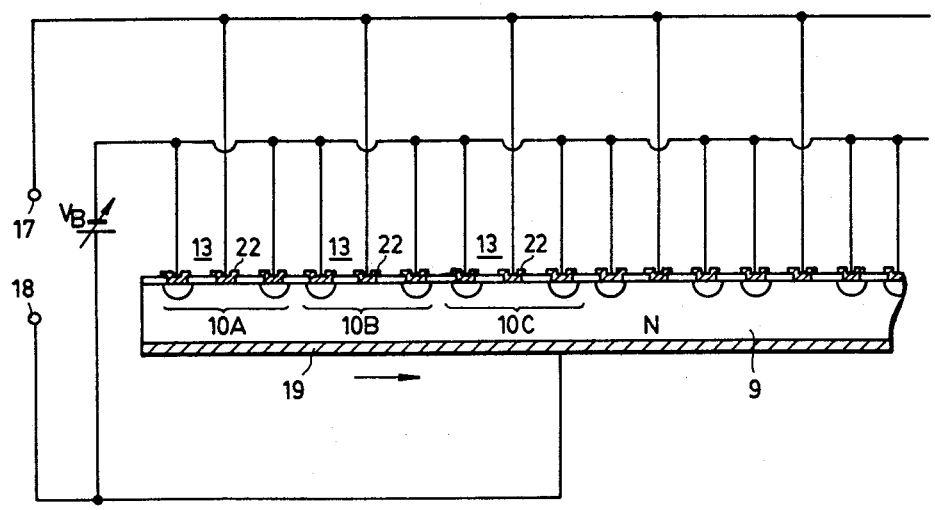

FIG. 6 shows a further embodiment according to the present invention in which the capacity reading section 13 has a so-called Schottky-barrier structure comprising a metallic-semiconductive barrier formed between the semiconductor substrate 9 and a desired metal 22 provided thereon.

As described above, the capacity reading section 13 may have any one of the PN junction structure, MIS structure and Schottky-barrier structure. However, the depletion layer control section 16, too, may have any one of those structures.

When the sections 13 and 16 are arranged to form PN junctions in the semiconductor substrate therearound, any desired conduction form may be selected. Further, by keeping the carrier concentration of the semiconductor substrate constant and partially doping it with different carrier concentrations in a manner such as ion implantation, etc., it is possible to make regions for the variable capacitor elements which have different carrier concentrations from each other. That is, any means for so arranging the carrier concentrations to relatively differ may be adopted.

Figure 7:
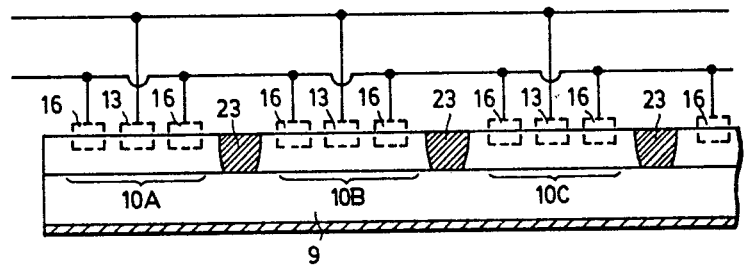

FIG. 7 illustrates a further embodiment according to the present invention where insulated regions 23 are formed between respective adjacent variable capacitor elements 10A, 10B, 10C . . . . The insulated regions 23 may be formed by any insulated material such as an oxidant layer, glass, etc., or may be constructed as an air isolation structure by providing vacant spaces.

By thus providing the insulated regions 23, electrical interference between respective adjacent elements, namely variation of the Q factor, for example, can be prevented.

Although the variable capacitor elements in the above-described embodiments are arranged to have different threshold values, they are not restricted to such arrangement. For example, they may be classified into some groups so that the threshold values differ for respective groups.

Further, the elements need not be so disposed that the threshold values gradually and regularly vary in a certain horizontal direction of the semiconductor substrate. Since the depletion layer control sections of respective elements are commonly supplied with the same bias voltage, it is possible to always obtain the characteristic as shown in FIG. 4 where the capacity stepwise varies even if the elements having different threshold values are disposed at random.

Figure 8:
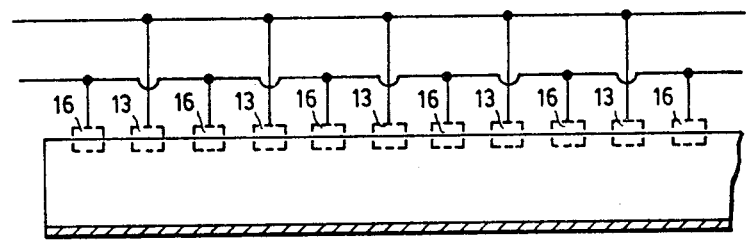
FIGS. 8 (a) and (b) are a sectional side view and a plan view, respectively, illustrating a further embodiment according to the present invention.
Figure 8:
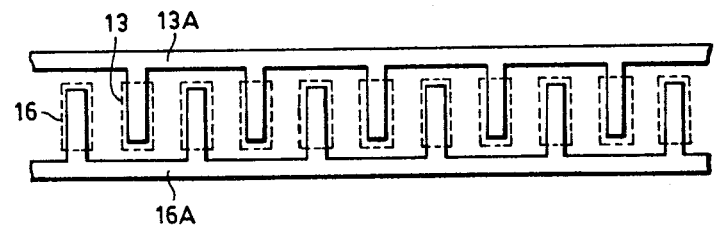

FIGS. 8 (a) and (b) show a further embodiment according to the present invention in which (a) the depletion layer control sections 16 and the capacity reading sections 13 are alternately positioned and (b) the electrode pattern thereof is as shown, where the reference numerals 13A and 16A denote the electrodes of the sections 13 and 16, respectively.

As apparent from the description, the present invention, so arranged that a plurality of variable capacitor elements each having depletion layer control sections and a capacity reading section are positioned in portions of a semiconductor substrate having carrier concentrations differ from each other, can realize the following effects:

(1) The capacity variation is precisely controlled over a wide range because the capacity variation characteristic with respect to bias voltage can be designed as desired.

(2) It is possible to keep Q-factor variation small as well as to design the capacity variation range large.

(3) Capacity variation caused by an input signal itself is kept small, resulting in minimal signal deterioration because the bias voltage terminal and the capacity reading terminal are provided independently.

(4) A better yield can be expected because there is no need of providing ion implantation as an impurity control means.

(5) As being integrated in a substrate common to the semiconductor integrated circuit, the variable capacitor enables the part to be minimized in size and light in weight, thus contributing to reduction of the production cost.

The embodiments of the invention in which an exclusive property or privilege is claimed are defined as follows:

1. A variable capacitor, comprising a semiconductor substrate; a plurality of variable capacitor arrangements which are provided at spaced locations on said substrate, which each include depletion layer control means for controlling a depletion layer in an adjacent region of said substrate, and which each include capacity reading means for providing at a capacity reading terminal a capacitance which is dependent on the size of said depletion layer and the carrier concentration of said substrate in the region of said depletion layer; and bias voltage applying means for applying a bias voltage from a variable voltage source to said depletion layer control means; said semiconductor substrate having a different carrier concentration in the region of each of said capacity reading means.

2. A variable capacitor as claimed in claim 1, wherein the carrier concentration of said semiconductor substrate gradually increases in a direction therealong.

3. A variable capacitor as claimed in claim 10, including means defining insulated regions between respective said variable capacitor arrangements.

4. A variable capacitor as claimed in claim 1, wherein each said depletion layer control means includes means defining a PN junction.

5. A variable capacitor as claimed in claim 1, wherein each said depletion layer control means includes an insulator layer provided on said semiconductor substrate and an electrode provided on said insulator layer.

6. A variable capacitor as claimed in claim 1, wherein each said depletion layer control means includes means defining a Shottky-barrier structure.

7. A variable capacitor as claimed in claim 1, wherein each said capacity reading means includes means defining a PN junction.

8. A variable capacitor as claimed in claim 1, wherein each said capacity reading means includes an insulator layer provided on said semiconductor substrate and an electrode provided on said insulator layer.

9. A variable capacitor as claimed in claim 1, wherein each said capacity reading means includes means defining a Schottky-barrier structure.

10. A variable capacitor, comprising: a semiconductor substrate, said substrate having a different carrier concentration in the region of each of a plurality of spaced first locations thereon; plural depletion layer control electrode means, each said depletion layer control electrode means being provided on said substrate at a respective one of said first locations; plural capacitance electrode means, each said capacitance electrode means being provided on said substrate in the region of a respective one of said first locations and being connected to a common first terminal; a second terminal and means connecting said second terminal to a second location on said substrate which is spaced from each of said first locations; and means for applying a common variable bias voltage between said second terminal and each of said depletion layer control electrode means, said bias voltage producing a depletion layer in said substrate in the region of each said depletion layer control electrode means, each said depletion layer having a thickness which is dependent on the magnitude of said bias voltage and each said depletion layer inducing a capacitance between the associated capacitance electrode means and said second location, the magnitude of such capacitance being dependent on the magnitude of said bias voltage and on the carrier concentration of said substrate in the region of the associated capacitance electrode means, the total capacitance provided between said first and second terminals being the sum of the capacitances between said second terminal and each of said capacitance electrode means and decreasing progressively as said bias voltage is increased.

11. The variable capacitor according to claim 10, including two said depletion layer control electrode means in the region of each of said first locations on said semiconductor substrate.

12. The variable capacitor according to claim 10, including means defining an insulating region between adjacent said first locations on said semiconductor substrate.

13. The variable capacitor according to claim 10, wherein the carrier concentration in said semiconductor substrate increases progressively in a direction, and wherein said first locations are provided at spaced intervals along said substrate in said direction.

14. The variable capacitor according to claim 10, wherein one of said depletion layer control electrode means and said capacitance electrode means includes a layer of semiconductor material provided on said substrate and an electrode provided on said semiconductor layer, one of said substrate and said semiconductor layer being a P-type semiconductor and the other of said substrate and said semiconductor layer being an N-type semiconductor.

15. The variable capacitor according to claim 10, wherein one of said depletion layer control electrode means and said capacitance electrode means includes an insulator layer provided on said substrate and an electrode provided on said insulator layer.

16. The variable capacitor according to claim 10, where one of said depletion layer control electrode means and said capacitance electrode means includes a metallic-semiconductive barrier provided on said semiconductor substrate and a metallic electrode provided on said metallic-semiconductor barrier.

17. The variable capacitor according to claim 10, wherein said means connecting said second terminal to said second location on said substrate includes an electrode provided on said substrate at said second location and connected to said second terminal.

18. The variable capacitor according to claim 17, wherein said substrate has first and second surfaces on opposite sides thereof, wherein said depletion layer control electrode means and said capacitance electrode means are provided on said first surface of said substrate, and wherein said electrode is provided on said second surface of said substrate.

19. The variable capacitor according to claim 10, wherein the capacitance between each said capacitance electrode means and said second location changes rapidly from a maximum value to a minimum value when said bias voltage is increased above a threshold voltage, and wherein said threshold voltage is dependent on the carrier concentration in said substrate in the region of such capacitance electrode means, each said capacitance electrode means thereby having a unique threshold voltage associated therewith, and wherein said progressive decrease of said total capacitance between said first and second terminals occurs in a steplike manner as said bias voltage is increased.

* * * * *